US011716894B2

(12) United States Patent
Su et al.

(10) Patent No.: US 11,716,894 B2
(45) Date of Patent: Aug. 1, 2023

(54) METHOD FOR PREPARING PEROVSKITE SOLAR CELL

(71) Applicant: NATIONAL TAIWAN UNIVERSITY, Taipei (TW)

(72) Inventors: Wei-Fang Su, Taipei (TW); Shih-Han Huang, Taipei (TW); Yu-Ching Huang, New Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 197 days.

(21) Appl. No.: 17/381,238

(22) Filed: Jul. 21, 2021

(65) Prior Publication Data
US 2022/0029098 A1 Jan. 27, 2022

Related U.S. Application Data

(60) Provisional application No. 63/055,404, filed on Jul. 23, 2020.

(51) Int. Cl.
*H01L 51/50* (2006.01)
*H10K 71/15* (2023.01)
*H10K 30/30* (2023.01)

(52) U.S. Cl.
CPC ............. *H10K 71/15* (2023.02); *H10K 30/30* (2023.02)

(58) Field of Classification Search
CPC .................................................... H10K 71/15
See application file for complete search history.

(56) References Cited

PUBLICATIONS

Shih-Han Huang, "Fabrication of High-Efficiency Large-Area Perovskite Solar Cell Using Scalable Liquid Formulations and Rapid Process in Ambient,Department of Materials Science and Engineering", College of Engineering, National Taiwan University, 136 pages.

*Primary Examiner* — Anthony Ho
(74) *Attorney, Agent, or Firm* — Bacon & Thomas, PLLC (57) ABSTRACT

A method for preparing a perovskite solar cell is disclosed, which comprises the following steps: providing a first electrode; forming an active layer on the first electrode; and forming a second electrode on the active layer. Herein, the active layer can be prepared by the following steps: mixing a perovskite precursor and a solvent mixture to form a precursor solution, wherein the solvent mixture comprises a first solvent and a second solvent, the first solvent is selected from the group consisting of γ-butyrolactone (GBL), dimethyl sulfoxide (DMSO), 2-methylpyrazine (2-MP), dimethylformamide (DMF), 1-methyl-2-pyrrolidone (NMP), dimethylacetamide (DMAc) and a combination thereof, and the second solvent is an alcohol; and coating the first electrode with the precursor solution and heating the precursor solution to form the active layer.

16 Claims, 5 Drawing Sheets

METHOD FOR PREPARING PEROVSKITE SOLAR CELL

CROSS REFERENCE TO RELATED APPLICATION

This application claims the benefit of filing date of U.S. Provisional Application Ser. No. 63/055,404, filed Jul. 23, 2020 under 35 USC § 119(e)(1).

BACKGROUND

1. Field

The present invention relates to a method for preparing a perovskite solar cell (PSC).

2. Description of Related Art

In recent years, with the advancement of technology, the power conversion efficiency (PCE) of perovskite solar cells has increased significantly from 3.8% to 22.1% in seven years, compared with the traditional polycrystalline silicon solar cells having only slow progress in decades. The perovskite solar cells further have the characteristics of low cost, easy manufacturing, light weight, and flexibility, so they are considered as the solar cells with great potential.

However, the conventional preparation method using toxic solvents and the spin coating process is only suitable for manufacturing small-area perovskite solar cells. Since the conventional preparation method is difficult to produce large-area perovskite solar cells with nano-scale thin films, the application field of the perovskite solar cells is limited.

Therefore, it is desirable to provide a method for preparing a perovskite solar cell and, in particular a method for preparing a large-area perovskite solar cell in ambient air to mitigate or obviate the afore-mentioned problems.

SUMMARY

The present invention provides a method for preparing a perovskite solar cell and a perovskite solar cell prepared by the same, wherein the perovskite solar cell is prepared by using a solution comprising nontoxic solvents through the slot-die coating process. Thus, it is possible to prepare the perovskite solar cell with large area in ambient air, so the application field of the perovskite solar cell can further be extended.

The method for preparing the perovskite solar cell of the present invention comprises the following steps: providing a first electrode; forming an active layer on the first electrode; and forming a second electrode on the active layer. Herein, the active layer is prepared by the following steps: mixing a perovskite precursor with a solvent mixture to form a precursor solution, wherein the solvent mixture comprises a first solvent and a second solvent, the first solvent is selected from the group consisting of γ-butyrolactone (GBL), dimethyl sulfoxide (DMSO), 2-methylpyrazine (2-MP), dimethylformamide (DMF), 1-methyl-2-pyrrolidone (NMP), dimethylacetamide (DMAc) and a combination thereof, and the second solvent is an alcohol; and coating the first electrode with the precursor solution and heating the precursor solution to form the active layer.

In the method for preparing the perovskite solar cell of the present invention, a hole transport layer may be formed on the first electrode before forming the active layer, but the present invention is not limited thereto. In addition, an electron transport layer may be formed on the active layer before forming the second electrode, and the electron transport layer comprises a bottom layer and a work function layer; but the present invention is not limited thereto.

Hence, the perovskite solar cell prepared by the method of the present invention comprises: a first electrode; an active layer disposed on the first electrode, wherein the active layer comprises perovskite; a second electrode disposed on the active layer, wherein the second electrode is opposite to the first electrode. In addition, the perovskite solar cell of the present invention may further comprise: a hole transport layer disposed between the first electrode and the active layer. Furthermore, the perovskite solar cell of the present invention may further comprise: an electron transport layer disposed between the active layer and the second electrode.

In the method for preparing the perovskite solar cell of the present invention, the precursor solution may be heated by a hot plate or near-infrared irradiation heating, but the present invention is not limited thereto. Preferably, the precursor solution is heated by near-infrared irradiation heating.

In the method for preparing the perovskite solar cell of the present invention, the first solvent may comprise a mixture of γ-butyrolactone and dimethyl sulfoxide, but the present invention is not limited thereto.

In the method for preparing the perovskite solar cell of the present invention, a volume ratio of γ-butyrolactone to dimethyl sulfoxide may be ranged from 0:1 to 1:0, 1:9 to 9:1, 1:9 to 7:3 or 1:9 to 5:5, but the present invention is not limited thereto.

In the method for preparing the perovskite solar cell of the present invention, a volume ratio of the first solvent to the second solvent may be ranged from 5:5 to 9:1, 6:4 to 9:1, 7:3 to 9:1 or 8:2 to 9:1, but the present invention is not limited thereto.

In the method for preparing the perovskite solar cell of the present invention, the alcohol may be selected from the group consisting of methanol, ethanol, propanol, butanol, pentanol, hexanol and a combination thereof, but the present invention is not limited thereto. In addition, the alcohol may be n-butanol, but the present invention is not limited thereto.

In the method for preparing the perovskite solar cell of the present invention, the time or the temperature for heating the precursor layer is not particularly limited, and may be adjusted according to the material or the thickness of the active layer, as long as the perovskite in the active layer has desired crystallinity and uniformity, and the obtained perovskite solar cell has desired photoelectric efficiency. The time for heating the precursor layer may be ranged from 5 seconds to 30 seconds, 7 seconds to 30 seconds, 10 seconds to 25 seconds or 10 seconds to 20 seconds. In addition, the temperature for heating the precursor layer may be ranged from 100° C. to 200° C., 110° C. to 200° C., 120° C. to 200° C. or 140° C. to 200° C.

In the method for preparing the perovskite solar cell and the perovskite solar cell prepared by the same of the present invention, a material of the bottom layer may comprise a fullerene derivative, but the present invention is not limited thereto.

In the method for preparing the perovskite solar cell and the perovskite solar cell prepared by the same of the present invention, a material of the work function layer may comprise tetraalkylammonium hydroxide, but the present invention is not limited thereto. In addition, the alkyl in the tetraalkylammonium hydroxide may be $C_1$-$C_6$ alkyl. Examples of the tetraalkylammonium hydroxide may be tetramethylammonium hydroxide (TMAOH), tetraethylammonium hydroxide, tetrapropylammonium hydroxide, tetrabutylammonium hydroxide (TBAOH), tetrapentylammonium hydroxide or tetrahexylammonium hydroxide. Preferably, the tetraalkylammonium hydroxide is tetraethylammonium hydroxide, tetrapropylammonium hydroxide, tetrabutylammonium hydroxide or tetrapentylammonium hydroxide. More preferably, the tetraalkylammonium hydroxide is tetrapropylammonium hydroxide or tetrabutylammonium hydroxide. Most preferably, the tetraalkylammonium hydroxide is tetrabutylammonium hydroxide. However, the present invention is not limited thereto.

In the method for preparing the perovskite solar cell and the perovskite solar cell prepared by the same of the present invention, a material of the second electrode may comprise Au, Ag, Cu, Al, Pd, Ni, ITO, FfO, ATO, AZO, IZO, GZO, ITZO, IGZO or a combination thereof. Preferably, the material of the second electrode comprises Au, Ag, Cu, Al, Pd, ITO, FTO, AZO, IZO, GZO, ITZO, IGZO or a combination thereof. More preferably, the material of the second electrode comprises Au, Ag, Cu, ITO, FTO, GZO, ITZO, IGZO or a combination thereof. Most preferably, the material of the second electrode comprises Ag, ITO, FTO or a combination thereof. However, the present invention is not limited thereto.

In the method for preparing the perovskite solar cell of the present invention, the precursor solution may be applied onto the first electrode through a slot-die coating process, but the present invention is not limited thereto.

Other novel features of the disclosure will become more apparent from the following detailed description when taken in conjunction with the accompanying drawings.

DETAILED DESCRIPTION OF EMBODIMENT

Different embodiments of the present invention are provided in the following description. These embodiments are meant to explain the technical content of the present invention, but not meant to limit the scope of the present invention. A feature described in an embodiment may be applied to other embodiments by suitable modification, substitution, combination, or separation.

It should be noted that, in the present specification, when a component is described to have an element, it means that the component may have one or more of the elements, and it does not mean that the component has only one of the element, except otherwise specified.

Moreover, in the present specification, the ordinal numbers, such as "first" or "second", are used to distinguish a plurality of elements having the same name, and it does not mean that there is essentially a level, a rank, an executing order, or a manufacturing order among the elements, except otherwise specified. A "first" element and a "second" element may exist together in the same component, or alternatively, they may exist in different components, respectively. The existence of an element described by a greater ordinal number does not essentially means the existent of another element described by a smaller ordinal number.

Moreover, in the present specification, the terms, such as "top", "bottom", "left", "right", "front", "back", or "middle", as well as the terms, such as "on", "above", "under", "below", or "between", are used to describe the relative positions among a plurality of elements, and the described relative positions may be interpreted to include their translation, rotation, or reflection.

Moreover, in the present specification, when an element is described to be arranged "on" another element, it does not essentially mean that the elements contact the other element, except otherwise specified. Such interpretation is applied to other cases similar to the case of "on".

Moreover, in the present specification, the terms, such as "preferably" or "advantageously", are used to describe an optional or additional element or feature, and in other words, the element or the feature is not an essential element, and may be ignored in some embodiments.

Structure of Perovskite Solar Cell

Figure 1:
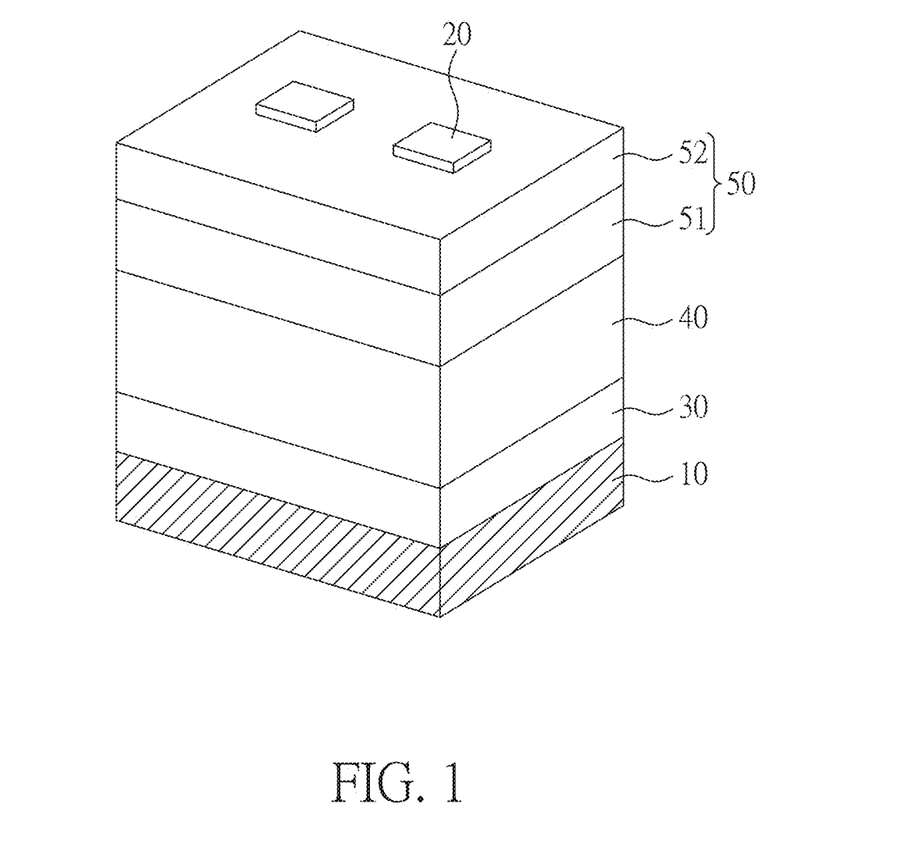
FIG. 1 is a perspective view of a perovskite solar cell.

FIG. 1 is a perspective view of a perovskite solar cell.

As shown in FIG. 1, the perovskite solar cell 1 prepared by the method for preparing the perovskite solar cell of the present invention comprises a first electrode 10, a second electrode 20, a hole transport layer 30, an active layer 40 and an electron transport layer 50. Herein, the active layer 40 is disposed on the first electrode 10 and comprises perovskite. The second electrode 20 is disposed on the active layer 40, and the second electrode 20 is opposite to the first electrode 10. The hole transport layer 30 is disposed between the first electrode 10 and the active layer 40. The electron transport layer 50 comprises a bottom layer 51 and a work function layer 52, and the electron transport layer 50 is disposed between the active layer 40 and the second electrode 20.

Method for Preparing Perovskite Solar Cell

The method for preparing the perovskite solar cell of the present invention comprises the following steps: providing a first electrode 10; forming an active layer 40 on the first electrode 10; and forming a second electrode 20 on the active layer 40. Herein, the active layer 40 is prepared by the following steps: mixing a perovskite precursor and a solvent to form a precursor solution, wherein the solvent comprises a first solvent and a second solvent, the first solvent is selected from the group consisting of γ-butyrolactone, dimethyl sulfoxide, 2-methylpyrazine, dimethylformamide, 1-methyl-2-pyrrolidone, dimethylacetamide and a combination thereof, and the second solvent is an alcohol; and coating the first electrode 10 with the precursor solution and heating the precursor solution to form the active layer 40. In addition, a hole transport layer 30 is formed on the first electrode 10 before forming the active layer 40. Moreover, an electron transport layer 50 is formed on the active layer 40 before forming the second electrode 20, wherein the electron transport layer 50 comprises a bottom layer 51 and a work function layer 52.

Preparation of Perovskite Solar Cell

A FTO glass (i.e. the first electrode 10) was cleaned by sequential sonication in acetone, methanol and isopropanol. The thickness of FTO is 600 nm. In ambient air, 74.6 mg of nickel acetate tetrahydrate ($Ni(CH_3COO)_2 \cdot 4H_2O$) was dissolved in 1 mL of anhydrous ethanol. The solution was then stirred at 60° C. until it became a transparent green solution. After adding 18 μL of ethanolamine, 1 mL of NiO$_x$ precursor solution was mixed with 200 μL of TMAOH solution, which contains 54 mg of tetramethylammonium hydroxide pentahydrate (TMAOH.5H$_2$O) in 1 mL of anhydrous ethanol. Then, the solution was filtered with 0.22 μm poly(1,1,2,2-tetrafluoroethylene) (PTFE) before using them. The solution was controlled at the coating speed of 1 m/min and the feeding rate of 1.2 mL/min to apply onto the cleaned FTO glass by the slot-die coating process in ambient air (the height of the upstream and downstream lips was in the range of 180-200 μm for the slot-die head). Then, the dry and crystalline film of NiO$_x$ was obtained by passing through the 3 kW near-infrared lamp (NIR) at the speed of 0.06 m/min. Thus, the hole transport layer 30 was formed on the first electrode 10, and the thickness of the hole transport layer 30 was 50 nm.

Then, in an N$_2$ glove box, 96 mg of methylammonium iodide (MAI) and 276 mg of lead iodide (PbI$_2$) were dissolved in the solvent mixtures of γ-butyrolactone (GBL), dimethyl sulfoxide (DMSO) and n-butanol with the volume ratio of 1:9:0 or 1:8:1 to obtain 0.6 M of the perovskite precursor solution. The perovskite precursor solution was controlled at the coating speed of 0.45 m/min and the feeding rate of 1.2 mL/min to apply onto the hole transport layer 30 by the slot-die coating process in ambient air. The wet film was dried and crystallized by passing through the 6 kW NIR at different irradiation time. Thus, the active layer 40 was formed on the hole transport layer 30. By controlling the concentration of the perovskite precursor solution, and the thickness of the active layer 40 was 700 nm.

Then, in an N$_2$ glove box, [6,6]-phenyl-C61-butyric acid methyl ester (PCBM) was dissolved in o-xylene to obtain the PCBM solution (15 mg/mL). The PCBM solution was controlled at the coating speed of 0.4 m/min and the feeding rate of 1.2 mL/min to apply onto the active layer 40 by the slot-die coating process in ambient air. The PCBM wet film was dried and crystallized after moving through the 3 kW NIR at the speed of 1.5 m/min. Thus, the PCBM layer (i.e. the bottom layer 51) was formed on the active layer 40, the PCBM layer was the bottom layer 51 of the electron transport layer 50, and the thickness of the bottom layer 51 was 80 nm.

Then, in an N$_2$ glove box, tetrabutylammonium hydroxide (TBAOH) was dissolved in IPA to obtain 0.05 wt % of the TBAOH solution. The TBAOH solution was controlled at the coating speed of 0.5 m/min and the feeding rate of 1.2 mL/min to apply onto the PCBM layer. The TBAOH film was then dried by passing through the 3 kW NIR at 2.2 m/min to form the work function layer 52, and the thickness of the work function layer 52 was 5 nm.

Finally, 100 nm of silver (Ag) electrodes or transparent electrodes was vacuum deposited on the work function layer 52 to form the second electrode 20.

Embodiment 1

In the perovskite solar cell 1 of the present embodiment, the first electrode 10 was formed by FTO, the second electrode 20 was formed by Ag, the hole transport layer 30 was formed by NiO$_x$, the active layer 40 was formed by MAPbI$_3$, the bottom layer 51 was formed by PCBM and the work function layer 52 was formed by TBAOH. The active layer 40 was formed by the slot-die coating process, wherein the first solvent used for forming the active layer 40 comprised γ-butyrolactone and dimethyl sulfoxide, the second solvent was n-butanol, and the volume ratio of γ-butyrolactone, dimethyl sulfoxide and n-butanol was 1:8:1. In addition, in the present embodiment, the NIR irradiation time for forming the active layer 40 was 13 seconds.

Embodiment 2

The present embodiment is similar to Embodiment 1, except that the NIR irradiation time for forming the active layer 40 was 14.5 seconds in the present embodiment.

Embodiment 3

The present embodiment is similar to Embodiment 1, except that the NIR irradiation time for forming the active layer 40 was 16 seconds in the present embodiment.

Embodiment 4

The present embodiment is similar to Embodiment 1, except that the NIR irradiation time for forming the active layer 40 was 17.5 seconds in the present embodiment.

Embodiment 5

The present embodiment is similar to Embodiment 1, except that the NIR irradiation time for forming the active layer 40 was 19 seconds in the present embodiment.

Comparative Embodiment 1

The present comparative embodiment is similar to Embodiment 1, except that the first solvent used for forming the active layer 40 comprised γ-butyrolactone and dimethyl sulfoxide, the second solvent was not added, and the volume ratio of γ-butyrolactone to dimethyl sulfoxide was 1:9.

Comparative Embodiment 2

The present comparative embodiment is similar to Comparative Embodiment 1, except that the NIR irradiation time for forming the active layer 40 was 14.5 seconds in the present comparative embodiment.

Comparative Embodiment 3

The present comparative embodiment is similar to Comparative Embodiment 1, except that the NIR irradiation time for forming the active layer 40 was 16 seconds in the present comparative embodiment.

Comparative Embodiment 4

The present comparative embodiment is similar to Comparative Embodiment 1, except that the NIR irradiation time for forming the active layer 40 was 17.5 seconds in the present comparative embodiment.

Comparative Embodiment 5

The present comparative embodiment is similar to Comparative Embodiment 1, except that the NIR irradiation time for forming the active layer 40 was 19 seconds in the present comparative embodiment.

Testing Example

Figure 2:
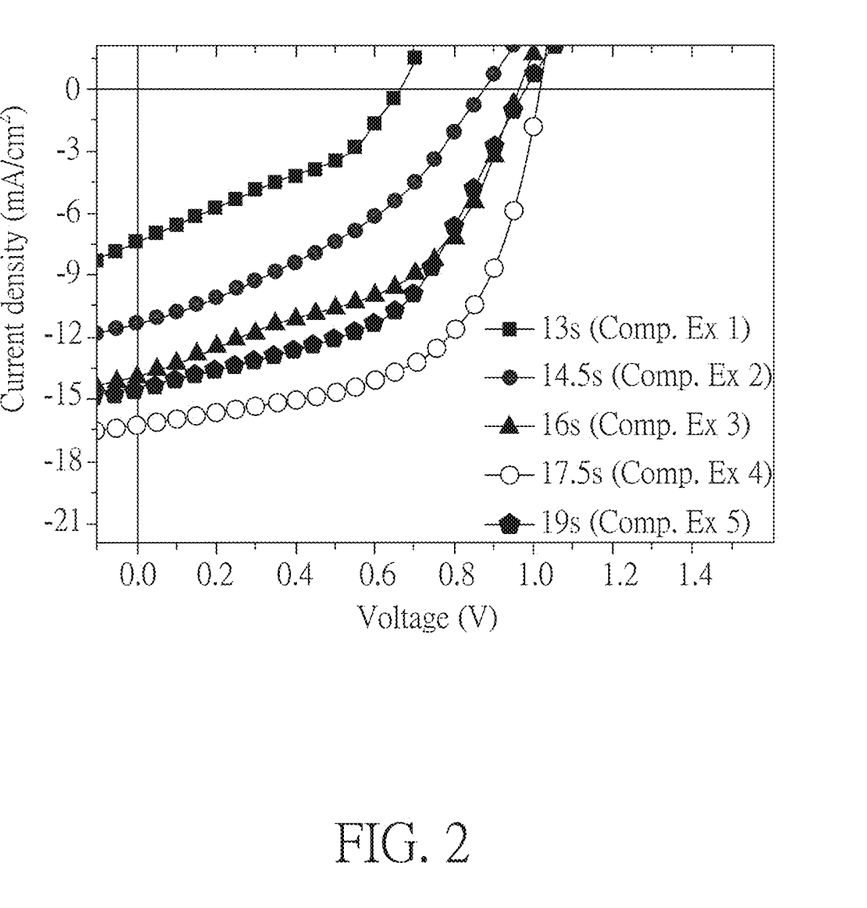
FIG. 2 shows current density vs. voltage (J-V) curves of perovskite solar cells prepared at different near-infrared irradiation time according to Comparative Embodiments 1 to 5 of the present invention.
Figure 3:
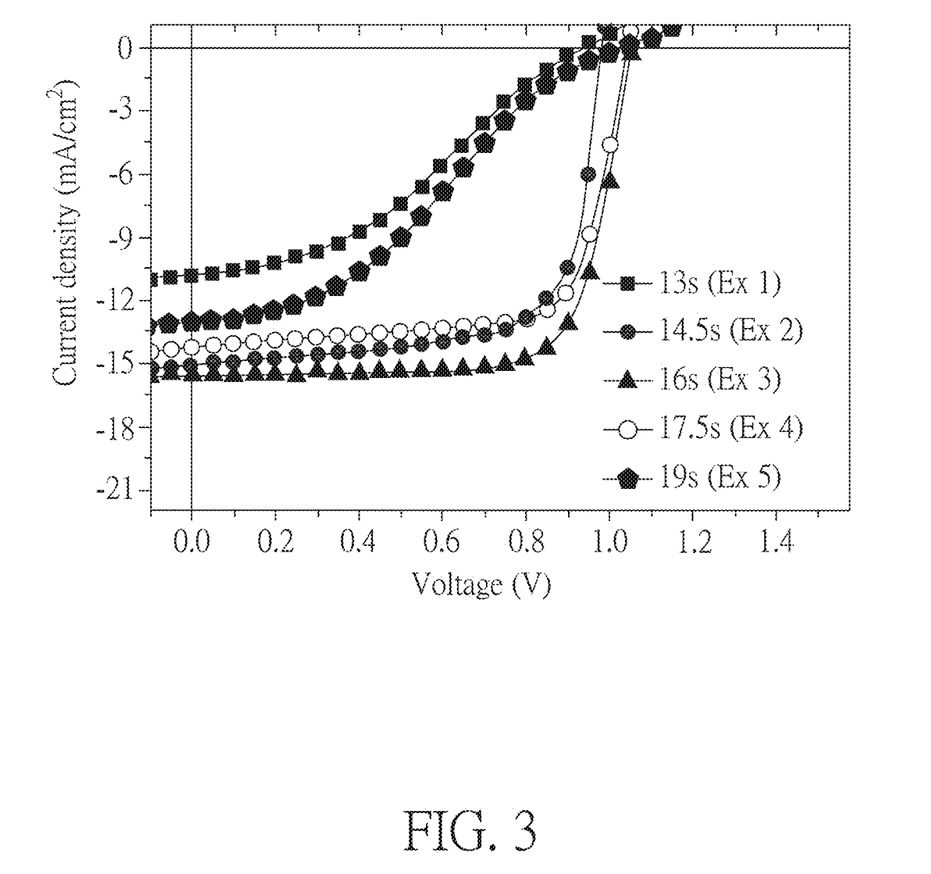
FIG. 3 shows current density vs. voltage (J-V) curves of perovskite solar cells prepared at different near-infrared irradiation time according to Embodiments 1 to 5 of the present invention.
Figure 4:
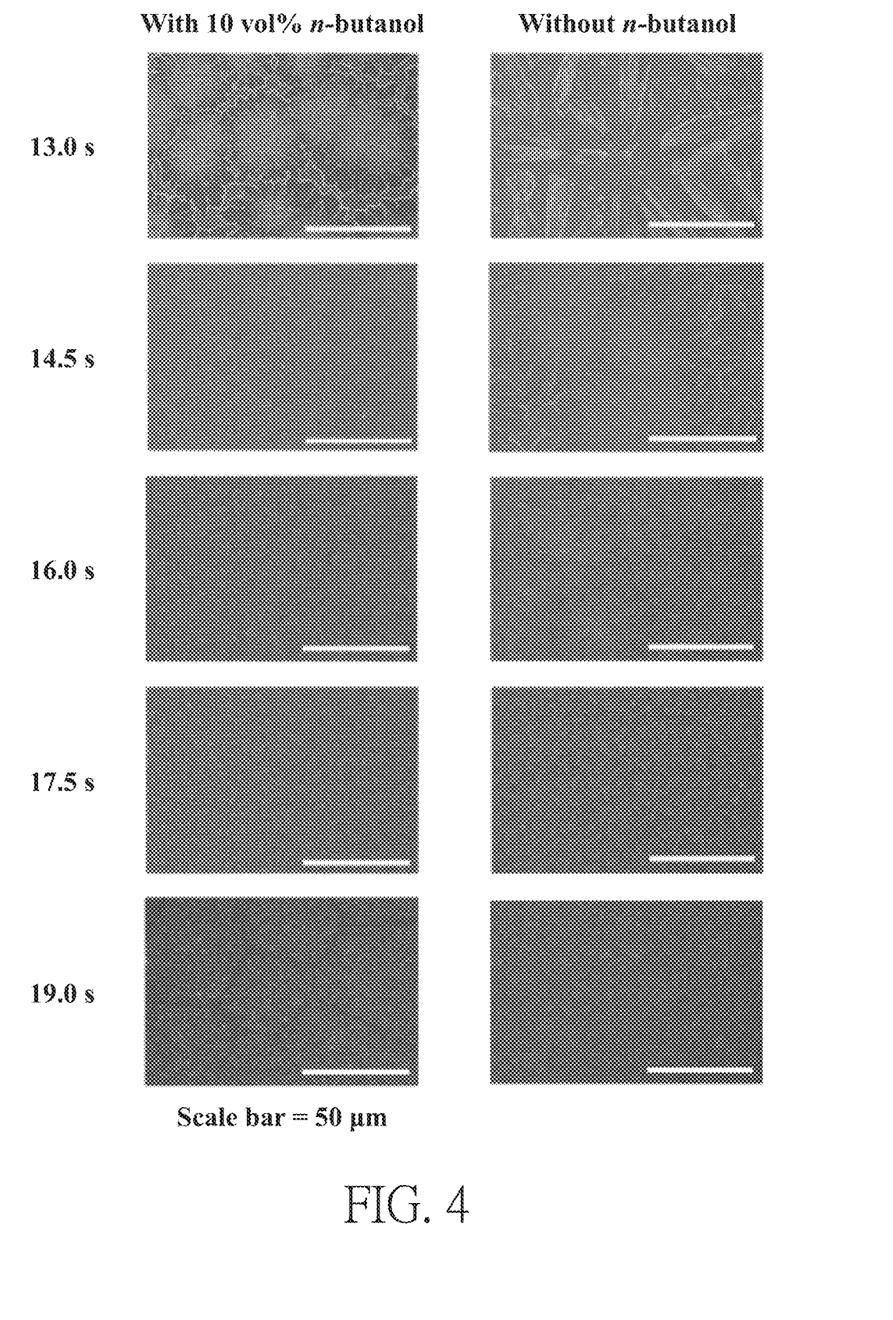
FIG. 4 shows SEM photos of active layers prepared at different near-infrared irradiation time according to Testing Example of the present invention.
Figure 5:
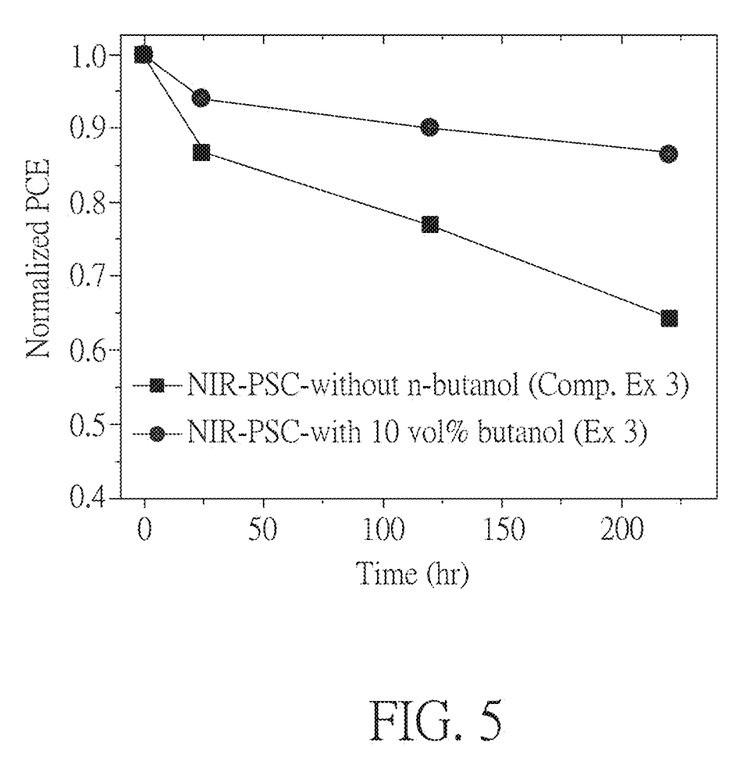
FIG. 5 is a diagram showing the normalized power conversion efficiencies of perovskite solar cells at different storage time according to Testing Example of the present invention.

FIG. 2 shows current density vs. voltage (J-V) curves of perovskite solar cells prepared at different near-infrared irradiation time according to Comparative Embodiments 1 to 5 of the present invention. FIG. 3 shows current density vs. voltage (J-V) curves of perovskite solar cells prepared at different near-infrared irradiation time according to Embodiments 1 to 5 of the present invention. FIG. 4 shows SEM photos of active layers prepared at different near-infrared irradiation time according to Testing Example of the present invention. FIG. 5 is a diagram showing the normalized power conversion efficiencies of perovskite solar cells at different storage time according to Testing Example of the present invention.

FIG. 2 shows the testing results of perovskite solar cells prepared in Comparative Embodiments 1 to 5 (Comp. Ex 1 to 5), wherein the perovskite solar cells were prepared by using the first solvent comprising γ-butyrolactone and dimethyl sulfoxide but without using the second solvent, and treating with NIR at different irradiation time. As shown in FIG. 2 and the following Table 1, the power conversion efficiencies (PCEs) of the perovskite solar cells prepared by the slot-die coating process enhance with the increasing NIR irradiation time, and the PCE of the perovskite solar cell (Comparative Embodiment 4) can be achieved to about 10% as the NIR irradiation time is 17.5 seconds. These results indicate that the transformation time from wet film to solid film is critical to achieve high crystalline perovskite, and thus high PCE of the perovskite solar cell can be obtained.

TABLE 1

Results of the perovskite solar cells prepared by using γ-butyrolactone and dimethyl sulfoxide with the volume ratio of 1:9

| Irradiation time (s) | $J_{SC}$ (mA/cm$^2$) | $V_{OC}$ (V) | FF (%) | PCE (%) |
| --- | --- | --- | --- | --- |
| 13.0 (Comp. Ex 1) | 7.39 | 0.66 | 35.57 | 1.73 (1.10) |
| 14.5 (Comp. Ex 2) | 11.31 | 0.87 | 37.93 | 3.75 (2.44) |
| 16.0 (Comp. Ex 3) | 13.90 | 0.96 | 47.26 | 6.33 (4.86) |
| 17.5 (Comp. Ex 4) | 16.26 | 1.02 | 56.86 | 9.38 (6.43) |
| 19.0 (Comp. Ex 5) | 14.50 | 0.97 | 49.39 | 7.01 (5.08) |

FIG. 3 shows the testing results of perovskite solar cells prepared in Embodiments 1 to 5 (Ex 1 to 5), wherein the active layers were prepared by using the first solvent including γ-butyrolactone and dimethyl sulfoxide and the second solvent being n-butanol, and treating with NIR at different irradiation time. The difference between Embodiments 1 to 5 and Comparative Embodiments 1 to 5 is that the second solvent was used in Embodiments 1 to 5, and the volume ratio of γ-butyrolactone, dimethyl sulfoxide and n-butanol was 1:8:1 in Embodiments 1 to 5. By adding the alcohol as the second solvent (n-butanol in Embodiments 1 to 5) to increase the NIR absorption, the transformation from wet film to solid film for forming the active layer can be accelerated. Thus, as shown in FIG. 3 and the following Table 2, by adding n-butanol as the second solvent, PCEs of the perovskite solar cells prepared by the slot-die coating process can be significantly enhanced, and the PCE of the perovskite solar cell (Embodiment 3) can be achieved to about 12.13% as the NIR irradiation time is 16 seconds.

TABLE 2

Results of the perovskite solar cells prepared by using γ-butyrolactone, dimethyl sulfoxide and n-butanol with the volume ratio of 1:8:1

| Irradiation time (s) | $J_{SC}$ (mA/cm$^2$) | $V_{OC}$ (V) | FF (%) | PCE (%) |
| --- | --- | --- | --- | --- |
| 13.0 (Ex 1) | 10.84 | 0.94 | 36.63 | 3.73 (2.10) |
| 14.5 (Ex 2) | 15.12 | 0.98 | 69.34 | 10.31 (7.31) |
| 16.0 (Ex 3) | 15.52 | 1.05 | 74.33 | 12.13 (9.61) |
| 17.5 (Ex 4) | 14.26 | 1.04 | 70.95 | 10.55 (8.21) |
| 19.0 (Ex 5) | 13.00 | 1.03 | 33.56 | 4.50 (2.92) |

FIG. 4 shows the comparison results of the morphologies of the active layers prepared in Embodiments 1 to 5 (prepared by adding n-butanol) and Comparative Embodiments 1 to 5 (prepared without adding n-butanol) at different NIR irradiation time. As shown in FIG. 4, when the first solvent comprising γ-butyrolactone and dimethyl sulfoxide and the second solvent being n-butanol were used, the prepared active layer 40 (the perovskite layer) exhibit denser morphology at shorter NIR irradiation time. Moreover, more NIR energy can be absorbed by using n-butanol as the second solvent, and the absorption of the NIR energy can be improved. Thus, larger perovskite grains are presented in the active layer 40 (the perovskite layer), and the PCEs of the perovskite solar cells can further be increased. Furthermore, the obtained perovskite solar cells have high open-circuit voltage (Voc), implying the good surface coverage of the active layer 40 (the perovskite layer) on the hole transport layer 30 prepared by the slot-die coating process and the NIR irradiation.

FIG. 5 shows the stability measurement of the perovskite solar cells prepared in Embodiment 3 (prepared by adding n-butanol) and Comparative Embodiment 3 (prepared without adding n-butanol). The unencapsulated devices were stored in dry air (25° C. and RH 30-40%). After 220 h, the perovskite solar cell fabricated with the solvent containing γ-butyrolactone, dimethyl sulfoxide and n-butanol with the volume ratio of 1:8:1 was remained at 87% of the initial PCE, but the perovskite solar cell fabricated with the solvent without n-butanol was remained at 64% of the initial PCE. These results imply that adding n-butanol as the second solvent significantly improves the morphology and crystal structure of the active layer 40 (the perovskite layer) fabricated by NIR heating, and thus the stability of the prepared perovskite solar cells can further be improved.

In conclusion, in the method for preparing the perovskite solar cell of the present invention, the nontoxic first solvent (γ-butyrolactone and dimethyl sulfoxide) and the second solvent (n-butanol) are used as the solvent for the perovskite precursor solution. The second solvent has the property of increasing the NIR energy absorption to facilitate the formation of larger perovskite grains, improve the film formation, bypass the post-annealing process or improve the stability of the prepared perovskite solar cell. In addition, the method of the present invention can prepare large-area perovskite solar cell in ambient air, and thus the application field of the perovskite solar cell can further be extended.

Although the present disclosure has been explained in relation to its embodiment, it is to be understood that many other possible modifications and variations can be made without departing from the spirit and scope of the disclosure as hereinafter claimed.

What is claimed is:

1. A method for preparing a perovskite solar cell, comprising the following steps:

providing a first electrode;

forming an active layer on the first electrode, wherein the active layer is prepared by the following steps:

mixing a perovskite precursor with a solvent mixture to form a precursor solution, wherein the solvent mixture comprises a first solvent and a second solvent, the first solvent is selected from the group consisting of γ-butyrolactone (GBL), dimethyl sulfoxide (DMSO), 2-methylpyrazine (2-MP), dimethylformamide (DMF), 1-methyl-2-pyrrolidone (NMP), dimethylacetamide (DMAc) and a combination thereof, and the second solvent is an alcohol; and coating the first electrode with the precursor solution and beating the precursor solution to form the active layer; and forming a second electrode on the active layer.

2. The method of claim 1, further comprising a step of: forming a hole transport layer on the first electrode before forming the active layer.

3. The method of claim 1, further comprising a step of: forming an electron transport layer on the active layer before forming the second electrode, wherein the electron transport layer comprises a bottom layer and a work function layer.

4. The method of claim 1, wherein the precursor solution is heated by near-infrared irradiation heating.

5. The method of claim 1, wherein the first solvent comprises γ-butyrolactone and dimethyl sulfoxide.

6. The method of claim 5, wherein a volume ratio of γ-butyrolactone to dimethyl sulfoxide is ranged from 1:9 to 9:1.

7. The method of claim 1, wherein a volume ratio of the first solvent to the second solvent is ranged from 5:5 to 9:1.

8. The method of claim 1, wherein the alcohol is selected from the group consisting of methanol, ethanol, propanol, butanol, pentanol, hexanol and a combination thereof.

9. The method of claim 8, wherein the alcohol is n-butanol.

10. The method of claim 1, wherein the precursor solution is heated for 5 seconds to 30 seconds.

11. The method of claim 1, wherein a temperature for heating the precursor solution is ranged from 100° C. to 200° C.

12. The method of claim 3, wherein a material of the bottom layer comprises a fullerene derivative.

13. The method of claim 3, wherein a material of the work function layer comprises tetraalkylammonium hydroxide.

14. The method of claim 13, wherein the tetraalkylammonium hydroxide is tetrabutylammonium hydroxide (TBAOH).

15. The method of claim 1, wherein a material of the second electrode comprises Au, Ag, Cu, Al, Pd, Ni, ITO, FTO, ATO, AZO, IZO, GZO, ITZO, IGZO or a combination thereof.

16. The method of claim 1, wherein the precursor solution is applied onto the first electrode through a slot-die coating process.

* * * * *